United States Patent [19]

Ahlgren

[11] Patent Number: 4,950,358
[45] Date of Patent: Aug. 21, 1990

[54] VAPOR PHASE EPITAXY OF SEMICONDUCTOR MATERIAL IN A QUASI-OPEN SYSTEM

[75] Inventor: William L. Ahlgren, Goleta, Calif.

[73] Assignee: Santa Barbara Research Center, Goleta, Calif.

[21] Appl. No.: 882,642

[22] Filed: Jul. 7, 1986

[51] Int. Cl.[5] ............................................. C30B 23/06
[52] U.S. Cl. ................................................... 156/610
[58] Field of Search ............... 156/601, 609, 610, 612, 156/613, 614, DIG. 89, DIG. 90, DIG. 72

[56] References Cited

U.S. PATENT DOCUMENTS

| | | | |
|---|---|---|---|
| 3,113,056 | 12/1963 | VanDoorn | 148/171 |
| 3,503,717 | 3/1970 | Wilson et al. | 156/610 |
| 3,619,282 | 11/1971 | Manley et al. | 156/611 |
| 3,619,283 | 11/1971 | Carpenter | 156/614 |
| 3,925,146 | 12/1975 | Olsen et al. | 156/601 |
| 4,325,776 | 4/1982 | Menzel | 156/610 |
| 4,542,712 | 9/1985 | Sato et al. | 156/614 |
| 4,584,054 | 4/1986 | Holland | 156/609 |
| 4,605,469 | 8/1986 | Shih et al. | 156/610 |

OTHER PUBLICATIONS

Vohl et al., "Vapor Phase Growth of $Hg_{1-x}Cd_xTe$ Epitaxial Layers", J. Electron. Mater., vol. 7, No. 5, 1978, pp. 659–678.

Open-tube isothermal vapor phase epitaxy of $Hg_{1-x}Cd_2Te$ on CdTe, S. H. Shin and J. G. Pasko, Appl. Phys. Lett., vol. 44, No. 4, Feb. 15, 1984, pp. 423–425.

Liquid Phase Growth of HgCdTe Epitaxial Layers, C. C. Wang, S. H. Shin, M. Chu, M. Lanir, and A. H. B. Vanderwyck, J. Electrochem. Soc.: Solid-State Science and Technology, vol. 127, No. 1, Jan. 1980, pp. 175–179.

Primary Examiner—Robert L. Stoll
Assistant Examiner—R. Bruce Brennan
Attorney, Agent, or Firm—W. C. Schubert; W. K. Denson-Low

[57] ABSTRACT

A method for forming an epitaxial layer upon a semiconductor substrate by vapor phase epitaxy is carried out within a quasi-open system having a controllably pressurized vertically orientated reaction chamber containing a charge of source material at a lower closed end. The chamber is heated at the lower end within a furnace such that the source material is vaporized. The substrate is introduced through an upper transfer chamber, passing through a gate valve so that it may be positioned by a moveable rod in a lower region of the chamber within the vapor given off by the source material. The source material vapor is deposited on the substrate, forming an epitaxial layer thereon. A cooling coil cools a portion of the chamber above the heated portion, thereby condensing the source vapor which may enter the cooled portion, such that the condensed vapor will remain in the lower, heated portion of the chamber. The transfer chamber and gate valve allow for maintaining the pressure within the chamber while the substrate is entered therein and during positioning. By varying the pressure within the chamber the composition of the vapor may be controlled and, hence, the composition of the epitaxial layer.

6 Claims, 1 Drawing Sheet

VAPOR PHASE EPITAXY OF SEMICONDUCTOR MATERIAL IN A QUASI-OPEN SYSTEM

BACKGROUND OF THE INVENTION

This invention relates to the vapor phase growth of semiconductor material such as mercury-cadmium-telleride (HgCdTe) epitaxial layers as in the construction of a semiconductor structure of an infrared radiation detector and, more particularly, to a method for causing the vapor phase growth of HgCdTe epitaxial layers within a quasi-open growth system.

HgCdTe semiconductor material is commonly employed in the construction of high performance radiation detectors. Typically, HgCdTe detectors are utilized for the detection of radiation in the infrared portion of the electromagnetic spectrum.

A typical HgCdTe detector is comprised of a CdTe base layer, which is transparent to the radiation to be detected, and an overlying layer of radiation absorbing HgCdTe. The HgCdTe layer is typically doped to have the characteristics of a p-type semi-conductor material. Within an upper surface of the HgCdTe layer a number of n-type junctions are implanted typically in a regular array. The interface of the n-type junctions and the p-type HgCdTe layer forms an array of photodiodes. When the foregoing radiation impinges upon a lower surface of the transparent base layer, the radiation then passes through the base layer and into the HgCdTe layer. Each photodiode of the array generates a current which is proportional to the radiation absorbed within the adjacent semiconductor material of the HgCdTe layer. This current is detected by a suitable means, typically an integrated circuit multiplexer, connected to the array for scanning the individual photodiodes thereof, whereby an image corresponding to the impinging radiation is formed.

The relative proportions of mercury to cadmium in the aforesaid radiation absorbing layer typically determines the energy bandgap of the layer and hence the range of wavelengths which will be absorbed therein. The relative proportions of Hg and Cd are indicated typically by expressing the compositional relationship in the form of $Hg_{1-x}Cd_xTe$. For example, if x is approximately 0.3, the radiation absorbing layer will be most sensitive to radiation having a wavelength range of approximately 2.0 to 3.5 microns. This range of wavelengths is associated typically with short wavelength infrared radiation, commonly abreviated as SWIR.

As may well be appreciated, it is a natural goal in the design of a high performance $Hg_{1-x}Cd_xTe$ radiation detecting array that the individual photodiodes of the array have essentially identical electrical and optical characteristics. This desired uniformity of photodiodes ensures that the resultant image will faithfully reproduce the relative intensities of the radiation incident upon the array. The surface morphology and compositional uniformity of the $Hg_{1-x}Cd_xTe$ radiation absorbing layer, among other factors, are important considerations in the design and fabrication of a high performance radiation detecting array.

It has been well known in the art to form the radiation absorbing layer by the method of liquid phase epitaxy (LPE), wherein a layer of HgCdTe is grown upon the surface of a CdTe substrate by contacting the surface of the CdTe substrate with a melt of HgCdTe. A portion of the HgCdTe is deposited upon the surface of the CdTe substrate forming a layer of HgCdTe. Typically, the LPE process is carried out by placing the constituent components in an open, or unsealed, container which is placed within a furnace, the furnace generating sufficient heat to provide the liquid phase. The LPE method, while suitable for forming a HgCdTe radiation absorbing epilayer, may also be disadvantageous for several reasons.

One disadvantage of the LPE method is that the surface morphology may not be optimum, due to the difficulty of controlling the growth of the HgCdTe epilayer. Another disadvantage of the LPE method is that there is a potential for non-uniformity in both the composition and thickness of the resultant HgCdTe epilayer. One further disadvantage of the LPE method is that inclusions from the HgCdTe melt may be deposited in the epilayer, resulting in surface defects which may prevent the epilayer from being useable for forming a regular array of photodiodes.

In response to the above mentioned disadvantages inherent in the LPE method, a vapor phase epitaxy (VPE) method has been utilized in the prior art to form the HgCdTe radiation absorbing epilayer. This method employs the vaporization of a HgTe source material, and the subsequent deposition of this vapor upon the surface of a CdTe substrate wafer.

This prior art VPE method was carried out, typically, in a sealed quartz ampoule wherein a CdTe wafer and a quantity of HgTe source material were placed. The ampoule was then exposed to heat sufficient to vaporize the source material, the vapor thus produced being deposited upon the surface of the wafer as a thin epitaxial layer. Diffusion of Cd from the wafer into the epitaxial layer results in the formation of a HgCdTe epilayer upon the CdTe wafer.

While this VPE method may be utilized to form a HgCdTe epilayer on the surface of a CdTe substrate, it has several disadvantages associated with its use. One major disadvantage is that, because the ampoule is sealed, very little control over the VPE deposition process is possible. Thus, the composition of the epilayer may be non-uniform, the uniformity being affected by the ratios of the total ampoule volume to source volume, the surface area of the substrate, and other factors. The sealed quartz ampoule method of VPE is particularly disadvantageous in a production environment, due to the expensive and time consuming operations involved in fabricating, sealing, and opening the ampoules. Practical considerations relating to the maximum size of a quartz ampoule place restrictions on the maximum wafer size which may be contained therein, resulting in a further disadvantage that radiation detectors having a large surface area may not be readily fabricated by the sealed ampoule method of the prior art.

SUMMARY OF THE INVENTION

The foregoing problems are overcome and other advantages are obtained by the use of a vapor phase epitaxy (VPE) system and method, in accordance with the invention, wherein the VPE is carried out in a quasi-open system having a controlled gas pressure.

In one embodiment of the invention a reaction chamber in the form of a vertical tube contains a source material, such as HgTe, disposed at a bottom, closed end of the chamber for production of an epitaxial layer of Hg—Cd—Te. By way of example, an open top end of the chamber communicates with a gas gate valve and a transfer chamber. A substrate of CdTe is introduced into the top of the reaction chamber from the transfer chamber, the substrate thereafter being lowered through the chamber to a predetermined distance above the source material. The bottom end of the chamber is heated in a furnace to a temperature such that the source material is vaporized. The resulting vapor is constrained to remain in the bottom, heated portion of the chamber by the pressure of a hydrogen atmosphere and by the action of cooling coils disposed around the chamber between the furnace and the gate valve, the cooling coils condensing the vapor as it attempts to rise in the chamber. The vapor so constrained is deposited on the surface of the substrate, thereby forming an epitaxial layer of essentially uniform composition having an excellent surface morphology displaying a mirror-like finish.

BRIEF DESCRIPTION OF THE DRAWING

The foregoing features and other aspects of the invention are explained in the following description taken in connection with the accompanying drawing wherein the sole Figure is a stylized view of a system incorporating the invention providing for the VPE growth of a semiconductor layer upon a substrate.

DETAILED DESCRIPTION OF THE INVENTION

Figure 1:
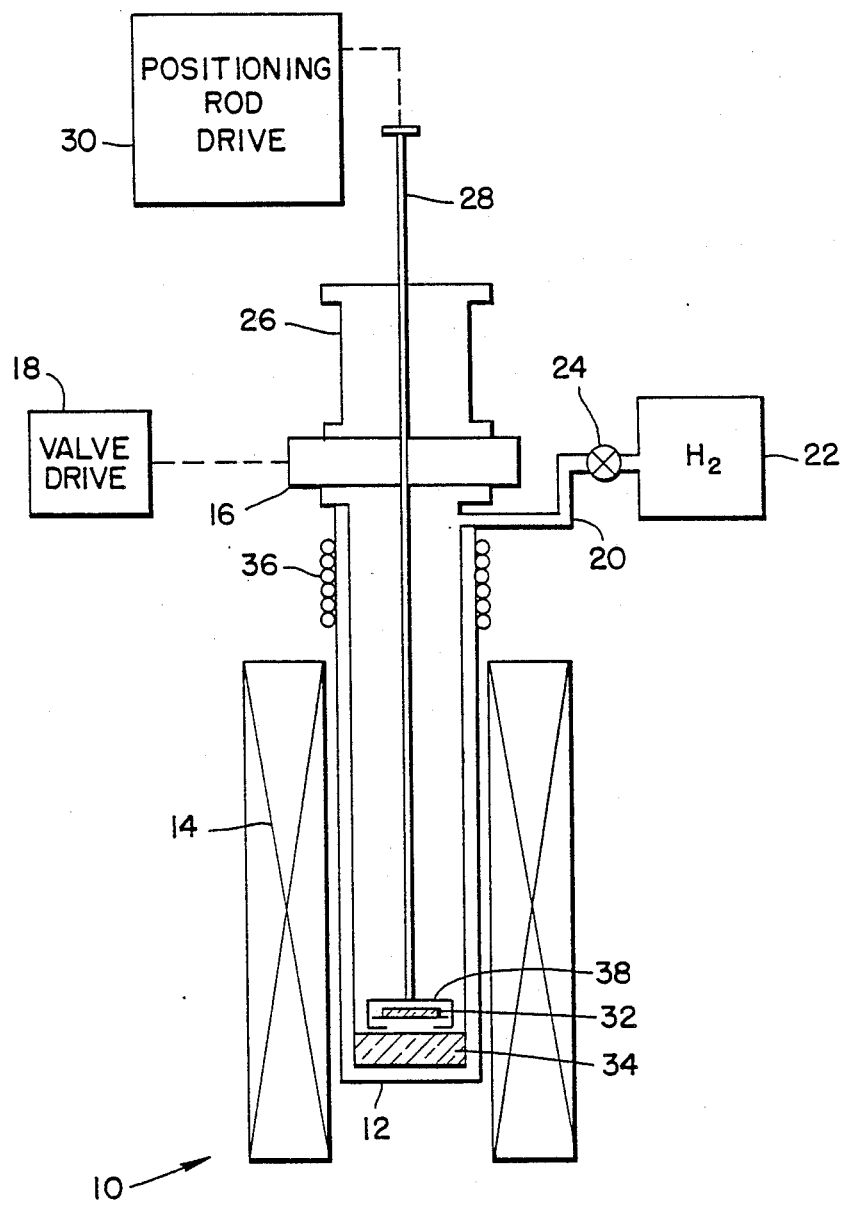

This invention concerns both a system and a method for accomplishing vapor phase epitaxy (VPE). Therefore, in this description, the method of the invention will be described as being carried out in a liquid phase epitaxy (LPE) system which is slightly modified to accomplich the VPE method of the invention. The features which make the system suitable for carrying out the VPE method include a reaction chamber wherein a substrate may be controllably positioned. The chamber should be capable of being heated to a temperature sufficient to vaporize a source material placed therein. The chamber should also be capable of maintaining at a predetermined pressure a gas introduced from an external gas supply. The chamber must also have a region coupled to a cooling means whereby the vapor emitted by the heated source may be condensed and thereby constrained to remain within the chamber.

Therefore, in accordance with the aforementioned general features, there is shown in the Figure a system whereby the VPE method of the invention may be carried out. To facilitate the description of the invention, a method of forming a HgCdTe epilayer upon a CdTe substrate will be described. It should be realized however, that the VPE method of the invention may be utilized to form epilayers of various suitable substances upon a variety of suitable substrates.

The system shown in the Figure for carrying out the invention is generally indicated by the number 10. The system 10 is comprised of a vertically orientated reaction chamber 12 of substantially elongated shape having a lower closed portion and an upper open end. Chamber 12 is constructed of a suitable refractory material, typically quartz, such that it may be subjected to elevated temperatures without detrimental effect. In order to achieve an elevated temperature, the lower portion of chamber 12 is placed within a furnace 14. Furnace 14 may be of any suitable type so long as the temperature of furnace 14 may be controlled to maintain a desired elevated temperature for extended periods of time.

Communicating with the upper open portion of chamber 12 is a gate valve 16 for permitting entry to chamber 12. A valve drive 18 is coupled to valve 16 permitting valve 16 to be opened and closed, thereby permitting entry. In order that chamber 12 may be pressurized with a gas, an opening within the top portion of chamber 12 is coupled to a gas line 20 and a source of gas 22, the gas typically being hydrogen. A pressure regulator valve 24 allows for the pressurization of chamber 12 to a desired gas pressure, and for the maintenance of the pressure at a desired level. Communicating with gate valve 16 is a transfer chamber 26 whereby a positioning means may be introduced through gate valve 16 into chamber 12. The positioning means may be in the form of a rod 28, or a wire, or some other suitable shape and may be comprised of stainless steel, or some other suitable substance such that it may withstand the high temperature within chamber 12. Transfer chamber 26 and gate valve 16 permit the introduction of rod 28 into chamber 12 without a substantial change in the aforementioned desired gas pressure maintained within chamber 12.

Rod 28 is positioned by a drive 30, typically an electric motor, coupled to a suitable mechanical mechanism, such as a pulley, so that it may be raised or lowered within chamber 12, and also maintained in a given vertical position for an extended period of time. Disposed at a lower end of rod 28 is a tray 38 for supporting the substrate 32. Tray 38 is comprised of a suitable refractory material, typically quartz, such that it may withstand the high temperatures encountered within chamber 12. Substrate 32 is vertically positioned relative to a source material 34 by rod 28, drive 30, and tray 38. Source material 34 is disposed at the closed bottom end of chamber 12, and is therefore within that portion of chamber 12 subjected to heat generated by furnace 14.

In this embodiment of the method of the invention substrate 32 is a relatively thin wafer comprised of CdTe, while the source material 34 is comprised of Hg and Te.

Disposed around an upper portion of chamber 12 between furnace 14 and gate valve 16 are a plurality of cooling coils 36, wherein a cooling fluid (not shown) is circulated by a pump (not shown). Cooling coils 36 maintain the upper portion of chamber 12 at a lower temperature than that portion of chamber 12 within furnace 14.

In operation, a solid or liquid charge of Te-rich HgTe, having a typical concentration of $Hg_{0.45}Te_{0.55}$ is placed at the bottom, closed end of chamber 12. This charge is the source material 34. Chamber 12 is then pressurized with hydrogen gas from gas source 22, the gas entering chamber 12 via gas line 20 and valve 24. The hydrogen gas pressure within chamber 12 is typically maintained at a guage pressure of 10 pounds per square inch.

The temperature within furnace 14 is increased by a suitable control means (not shown) to a temperature whereby the vaporization of source material 34 occurs. The temperature is maintained, typically, at approximately 554 degrees C. A wafer of CdTe semiconductor substrate 32, having been previously suitably prepared by conventional methods such that an epitaxial layer may be grown upon a surface, is placed upon tray 38. Tray 38, being disposed at the end of rod 28, is introduced into chamber 12 through transfer chamber 26 and gate valve 16. By the action of drive 30, rod 28 and tray 38 substrate 32 is positioned at a given distance above source 34. The given distance may vary widely between, typically, one to nine inches. The distance is selected such that the HgTe vapor emanating from source 34 will be deposited upon the suitably prepared surface of substrate 32 by the condensation of the HgTe vapor and its deposition upon the substrate 32 surface. A distance of from four to eight inches is, typically, optimum for growing epilayers most sensitive to SWIR radiation, it being understood that the distance may be varied to obtain different epilayer radiation absorbing characteristics.

Cooling coils 36 prevent HgTe vapor from rising to the top of chamber 12 by condensing the vapors within the portion of chamber 12 cooled by coils 36. The vapor so condensed will flow downwards within chamber 12, where the condensed HgTe will rejoin the source 34 charge, to be once again heated and vaporized. Thus a constant flow of source material 34 is maintained within chamber 12, without any appreciable portion of source material 34 escaping from chamber 12. Although the cooling means is shown to be comprised of cooling coils 36, it is understood that any suitable cooling means may be utilized, such as directing a stream of cold air upon chamber 12, so long as a portion of chamber 12 is cooled such that the source 34 vapors entering that portion of chamber 12 are condensed such that the condensed vapors will return to the charge of source material 34 to be vaporized once more.

The aforementioned hydrogen gas pressure within chamber 12 is selected such that it acts to control the vapor pressure of the mercury within the source material 34. Thus, the pressure of the hydrogen gas may be varied, if desired, to control the relative proportions of mercury and tellurium within the vapor. As the hydrogen pressure is increased, proportionately less mercury will enter the vapor phase. Similarly, as the hydrogen pressure is decreased, proportionately more mercury will enter the vapor phase. Therefore, it can be appreciated that by controlling the pressure of the hydrogen gas within chamber 12 that the relative proportions of mercury and tellurium within the vapor may be controlled. Hence, the composition of the semiconductor epitaxial layer formed upon substrate 32 may be controlled and, if desired, the composition may be varied as the epilayer is built up.

The foregoing selective deposition of mercury is an important aspect of the invention, in that it allows epitaxial layers of varying mercury and cadmium composition to be uniformily deposited upon the substrate 32, the cadmium diffusing from the substrate into the epilayer as the epilayer is built up. As was previously discussed, it is the relative proportions of mercury and cadmium within an epilayer that determine the width of the epilayer band gap, and hence, the range of wavelengths that will be absorbed within the epilayer. Therefore, it may be appreciated that the method of epilayer deposition as taught by the invention makes possible the construction of radiation detectors which have varying, or graded, radiation absorbing characteristics within the epilayer.

Other advantages over the prior art methods or LPE or sealed ampoule VPE made possible by the method of the invention are that, by maintaining a constant gas pressure an epilayer having a high degree of compositional uniformity may be grown. Although there may be some compositional grading at the substrate-epilayer interface, the epilayer will be highly uniform to a depth of several microns near the epilayer surface. Inasmuch as the aforementioned implanted junctions normally extend only to a depth of, typically, one micron from the epilayer surface, it can be seen that the epilayer formed by the invention is well suited for use with the implanted junction devices. The grading at the substrate-epilayer interface, because it occurs in an area of the device which is away from the active area near the implanted junctions, will normally not detrimentally affect device performance.

Another advantage made possible by the use of the method of the invention is that, because of the potentially high degree of compositional uniformity of the epilayer material, detectors fabricated as arrays of diode detecting elements will have a correspondingly high degree of uniformity among diodes as to such parameters as radiation cutoff wavelength, junction resistance, and diode spectral response.

Another advantage of the VPE method of the invention is that the surface morphology of the epilayer is excellent, the surface often displaying mirror-like qualities. As may be appreciated, such a surface morphology is well suited for forming implanted junctions therein, as leakage currents due to surface imperfections are reduced, resulting in array of photodiodes having a large junction resistance product.

Still a further advantage of the VPE method of the invention is that, because of the relative ease with which substrates may be inserted and withdrawn from the system, the method is well suited for manufacture at relatively high production rates. It should also be realized that because there is no restriction placed upon wafer size, as is the case in construction using the quartz ampoule of the prior art VPE method, that larger radiation detectors may be fabricated.

It should be understood that the above described embodiment of the invention is illustrative only and that modifications thereof may occur to those skilled in the art. Accordingly, this invention is not to be regarded as limited to the embodiment disclosed herein, but is to be limited only as defined by the appended claims.

What is claimed is:

1. A method for forming an epitaxial layer upon a substrate, which method comprises:
   providing a charge of source material within a lower portion of a vertically orientated cylindrical reaction chamber;
   pressurizing said chamber with a gas;
   heating the lower portion of the chamber so as to vaporize said charge to produce a vapor;
   positioning said substrate within said chamber such that said vapor interacts with said substrate such that an epitaxial layer is formed upon said substrate;
   controlling the pressure of the gas such that the relative concentrations of the chemical constituents of the vapor are varied, thereby varying the chemical constituents of the epitaxial layer; and
   cooling a portion of said chamber such that said vapor which may enter said portion is condensed.

2. A method of forming an epitaxial layer comprised substantially of $Hg_{1-x}Cd_xTe$ upon a substrate comprised substantially of CdTe, where x may vary within a range from 0.00 to 1.00, comprising the steps of:
   providing a vertically disposed elongated reaction chamber having a closed bottom end and an open top end;
   providing a gas-tight valve means communicating with the open end of the chamber;
   providing a charge of $Hg_{(1-x)}Te_x$ at the bottom end of the chamber;

pressurizing the chamber through an adjustable valve means to a pressure of gas;

vaporizing the charge to provide a vapor of $Hg_{(1-x)}Te_x$ within the chamber;

constraining the vapor to remain in a bottom portion of the chamber by condensing the vapor within a region of the chamber above the bottom end;

introducing a first substrate through the gas-tight valve means into the chamber;

positioning the substrate within the bottom portion of the chamber such that the vapor interacts with the substrate to form an epilayer upon the substrate; and varying the pressure of the gas during the formation of the epilayer to control the relative proportion of the Hg to Te within the vapor whereby the relative proportion of Hg to Cd is caused to vary within the epilayer.

3. The method as defined in claim 2 further comprising the steps of:

withdrawing from the chamber through the gas-tight valve means a substrate having an epilayer formed thereon; and introducing a second substrate through the gas-tight valve means into the chamber, the gas-tight valve means maintaining the desired pressure of the gas within the chamber during the steps of introducing a first substrate, withdrawing, and introducing a second substrate.

4. The method as defined in claim 2 wherein the step of positioning further comprises the steps of:

determining a distance at which to position the substrate relative to the bottom end of the chamber, the distance being determined as a function of the relative proportions of Hg and Te within the vapor at the determined distance; and positioning the substrate at the determined distance whereby the epitaxial layer formed upon the substrate is caused to have electrical or optical properties which are determined by the relative proportions of Hg and Te deposited thereon.

5. The method of claim 4 wherein the determined distance is between four to eight inches and wherein the epitaxial layer formed upon the substrate is substantially $Hg_{1-x}Cd_xTe$ wherein x is approximately 0.3, whereby the epilayer is most sensitive to SWIR having a range of wavelengths of approximately 2.0 to 3.5 microns.

6. The method of claim 2 wherein the gas is hydrogen.

* * * * *